(12) United States Patent
Wang et al.

(10) Patent No.: US 6,940,315 B2
(45) Date of Patent: Sep. 6, 2005

(54) HIGH SPEED SENSE AMPLIFIER FOR MEMORY OUTPUT

(75) Inventors: Shiou-Yu Alex Wang, Cupertino, CA (US); Joo-Young Kim, Fremont, CA (US); Kyoung-Chon Jin, San Jose, CA (US)

(73) Assignee: Programmable Microelectronics Corporation, San Jose, CA (US)

( * ) Notice: Subject to any disclaimer, the term of this patent is extended or adjusted under 35 U.S.C. 154(b) by 0 days.

(21) Appl. No.: 10/390,136

(22) Filed: Mar. 14, 2003

(65) Prior Publication Data

US 2004/0178829 A1 Sep. 16, 2004

(51) Int. Cl.[7] .............................................. G01R 19/00
(52) U.S. Cl. ............................. 327/52; 327/55; 327/56; 327/57
(58) Field of Search ............................ 327/51, 57, 199, 327/200, 215, 225; 365/189.07, 205, 207, 227

(56) References Cited

U.S. PATENT DOCUMENTS

| | | | |
|---|---|---|---|
| 5,798,967 A | | 8/1998 | Sarin et al. ............. 365/185.21 |
| 6,414,520 B1 | * | 7/2002 | Dupcak et al. ................ 327/52 |
| 6,441,649 B1 | * | 8/2002 | Martin et al. .................. 327/52 |

* cited by examiner

Primary Examiner—Kenneth B. Wells
(74) Attorney, Agent, or Firm—MacPherson Kwok Chen & Heid LLP

(57) ABSTRACT

A sense amplifier circuit includes a latch circuit to enhance the speed of a sensing operation and to obviate the need for a latch circuit to capture the output value of the sense amplifier circuit. In one embodiment, first and second differential amplifiers provide a differential signal to the latch circuit. The high gain in the latch circuit resolves the differential signal to a logic signal, which is then provided to an output amplifier. In one embodiment, the differential signal is provided to the latch circuit after the differential signal across the input terminals of the first and second differential amplifiers exceeds a predetermined value.

10 Claims, 9 Drawing Sheets

US 6,940,315 B2

HIGH SPEED SENSE AMPLIFIER FOR MEMORY OUTPUT

BACKGROUND OF THE INVENTION

1. Field of the Invention

The present invention relates to a design for a sense amplifier used in a memory circuit. In particular, the present invention relates to a design for sense amplifiers used in a memory circuit, such as a flash memory circuit.

2. Discussion of the Related Art

In a memory circuit, e.g., a non-volatile floating gate memory circuit ("flash" memory circuit), a sense amplifier circuit is shared by numerous memory cells for sensing their stored logic values. Typically, to sense the logic value stored in a memory cell, the output terminal of the memory cell is selectively coupled to an input terminal of the sense amplifier circuit, which amplifies the voltage received at the input terminal to provide a logic signal output that represents the stored logic value. This output logic signal is typically stored into a latch circuit external to the sense amplifier circuit. Typically, because a memory cell represents the logic value stored by the presence or the absence of a small amount of electrical charge, the memory circuit has little drive capability. Consequently, the sense amplifier circuit is required to have a high gain to allow it to amplify the signal provided by this small amount of electric charge into an output signal of conventional signal levels that can be processed in a conventional logic circuit. To achieve high performance, the output signal is required to settle rapidly. More recently, sense amplifier circuits are also designed with low power dissipation as a design goal. Thus, numerous design challenges are presented by a sense amplifier circuit.

SUMMARY

According to the present invention, a sense amplifier receives an input signal and a reference signal to provide a latched logic output signal, thereby obviating the need for a latch circuit external to the sense amplifier, as is required in the prior art. The latched output logic signal is achieved by incorporating a high gain latch circuit which is capable of resolving an analog differential signal to a logic signal at high speed.

According to one embodiment of the present invention, the sense amplifier includes first and second differential amplifiers, a latch circuit and an output amplifier. The first and second differential amplifiers each receive an input signal and a reference signal corresponding, for example, to the output signals of a selected cell in a memory array and a reference cell. From the input signal and the reference signal, the first and second differential amplifiers provide a differential signal across their respective output terminals. This differential signal represents, for example, an amplified difference in voltage across the input signal and the reference signal. The high gain in the latch circuit then resolves the differential signal to provide as output a logic signal and its complement. The output amplifier then amplifies these logic signals to the desired voltage levels.

According to one implementation, the sense amplifier circuit is powered down until a sensing operation is required (e.g., during a memory read access, after an address decoder completes decoding a memory address). During the sensing operation, the first and second amplifiers are powered up before the latch circuit and the output amplifier are powered up. In one implementation, switches allow the first and second differential amplifiers to set the bias in the latch circuit as the latch circuit powers up and isolate the latch circuit from the first and second differential amplifying while the differential signal develops.

The sense amplifier circuit can include a reset circuit that resets selected terminals in the latch circuit and at input terminals to predetermined voltages. In one embodiment, the reset circuit presets the selected terminals to known voltage references prior to the latch circuit powering up. By setting these selected terminals to the known voltages, transients or charge from previous sensing operations are prevented from interfering with the current sensing operation.

In one embodiment, a quiescent circuit sets a quiescent voltage in the terminals receiving the input signal and the reference signal, and a switch circuit equalizes the quiescent voltages in these terminals prior to the time when the input signal and the reference signal are coupled onto the receiving terminals.

In one embodiment, a bias circuit provides a bias voltage to operate the current sources in the first and second differential amplifiers. To speed up the rate at which the bias voltage is attained upon powering, a control signal and its logic complement are provided to the bias circuit with a predetermined delay between corresponding logic transitions. As the control signal and its complement control two current paths that affect the bias voltage in one implementation, the predetermined delay allows both current paths to be conducting at the same time during that delay, thereby reducing the time required for the bias voltage to reach its steady state value.

The present invention is better understood upon consideration of the detailed description below and the accompanying drawings.

BRIEF DESCRIPTION OF THE DRAWINGS

To facilitate cross-referencing among the figures, in these figures, like reference numerals are assigned to like features.

DETAILED DESCRIPTION OF THE PREFERRED EMBODIMENTS

Figure 1:
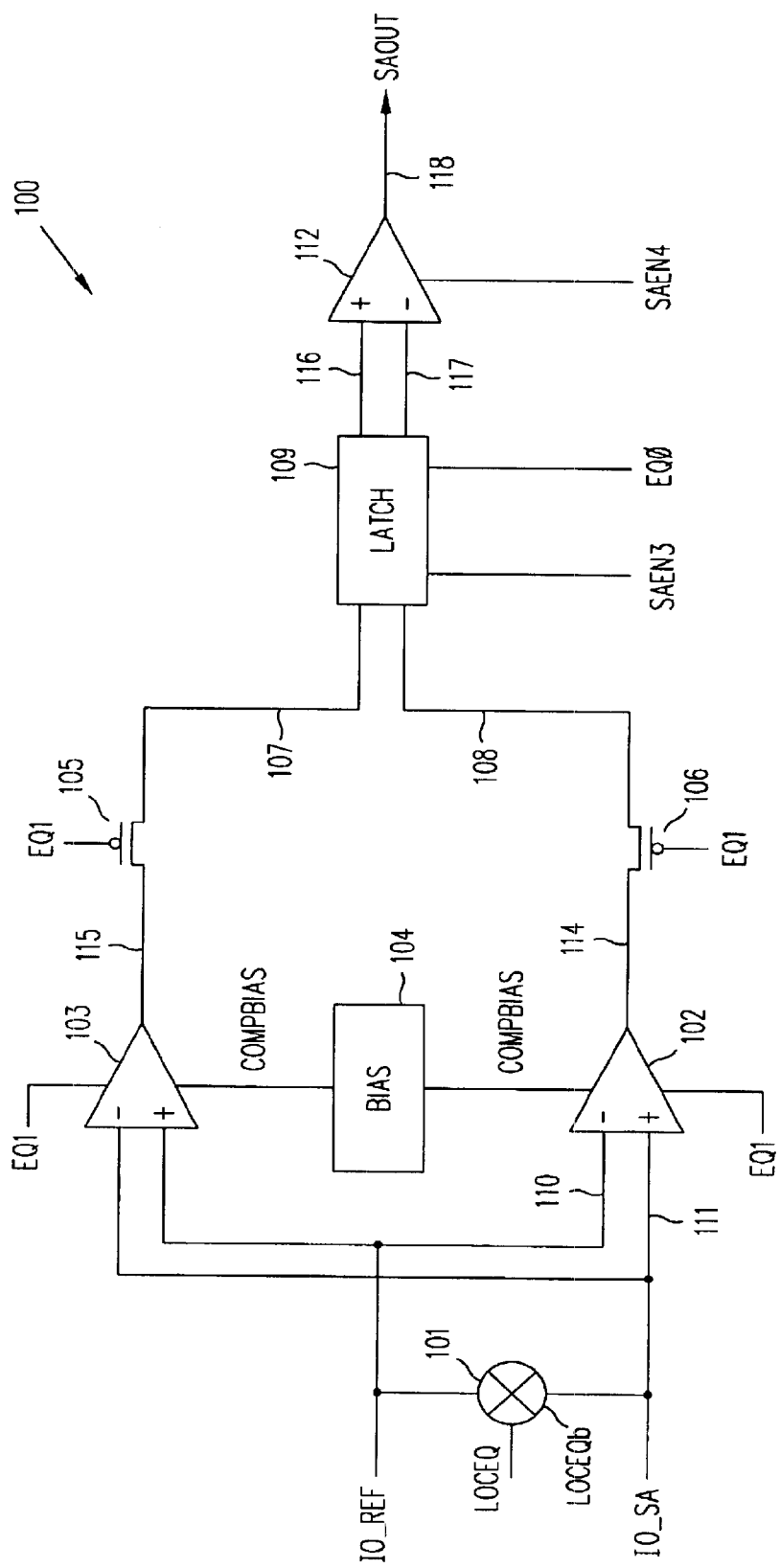
FIG. 1 is a functional schematic diagram showing sense amplifier circuit 100, in accordance with one embodiment of the present invention.

The present invention provides a sense amplifier circuit which is illustrated by reference to functional schematic diagram of FIG. 1. As shown in FIG. 1, sense amplifier circuit 100 receives input signals IO_SA and IO_REF at terminals 110 and 111, respectively. Signals IO_REF and IO_SA are output signals on the bit lines of a selected memory cell and a reference cell, respectively. Typically, an address decoder circuit selects the memory cell to provide signal IO_SA at terminal 111. Prior to a sensing operation by sense amplifier circuit 100, quiescent circuit 113 (not shown) is turned on to provide a quiescent voltage to terminals 110 and 111, so that the stored value in the selected memory cell may appear as a change in voltage from this quiescent voltage. To avoid any pre-existing offset voltage between terminals 110 and 111 immediately prior to the receipt of output signals of the selected memory cell and the reference cell, a transmission gate 101 is turned on momentarily.

Upon coupling the output signals of the reference cell and the selected memory cell to terminals 110 and 111 respectively, a voltage difference begins to develop across signals IO_REF and IO_SA. Typically, signal IO_REF from the reference cell can develop to about 10 millivolts. Depending on the stored value in the selected memory cell, signal IO_SA may be about 0 volts or about 20 millivolts, so that that the voltage difference across terminals 110 and 111 is approximately ±10 millivolts. This voltage difference is amplified by differential amplifiers 102 and 103, which provides a differential signal (formed by signals $N_{OUT}$ and $P_{OUT}$) across terminals 114 and 115. Typically, when fully developed, the differential signal has a magnitude of about ±80 millivolts. Differential amplifiers 102 and 103 receive bias signal COMPBIAS from bias circuit 104, which enables (i.e., powers up) differential amplifiers 102 and 103 and sets the current level of their internal current sources. In addition, control signal EQ1 holds the output signals at terminals 114 and 115 to ground, until shortly before latch circuit 109 powers up. In addition, control signal EQ0 resets the internal nodes of latch circuit 109 prior to latch 109 powering up, to remove any residual charge in latch 109 from a previous sensing operation.

As the differential signal across input terminals 110 and 111 develops, the differential signal across the output terminals of differential amplifiers 102 and 103 are held at ground voltage, until control signal EQ1 is asserted, which also renders isolation transistors 105 and 106 conducting. At this time, differential signal across terminals 114 and 115 settles rapidly because signals at input terminals 110 and 111 are substantially developed, thus setting the bias for latch 109. A short time later, when latch 109 powers up, the bias voltage across terminals 107 and 108 drive latch 109 into a definite state, thereby avoiding any undesirable transient responses that some times occur in the metastable cross-coupled circuit of latch 109. Consequently, latch 109 can provide a differential output logic signal across terminals 116 and 117 without rapidly and without undesirable transient effects. Further, because isolation transistors 105 and 106 can have relatively large on-resistance (e.g., time constant of 3 ns), a high impedance is presented to differential amplifiers 102 and 103, while the differential signal across terminals 114 and 115 develops. Because isolation transistors 105 and 106 are turned off between sensing operations, latch 109 retains the output value from the last sensing operation. Thus, the need for a latch circuit external to sense amplifier circuit 100 is obviated.

Shortly after latch 109 is powered up, differential amplifier 112 is also powered up to amplify and to convert the differential logic signal across terminals 116 and 117 into a single-ended signal SAOUT at terminal 118.

Figure 2:
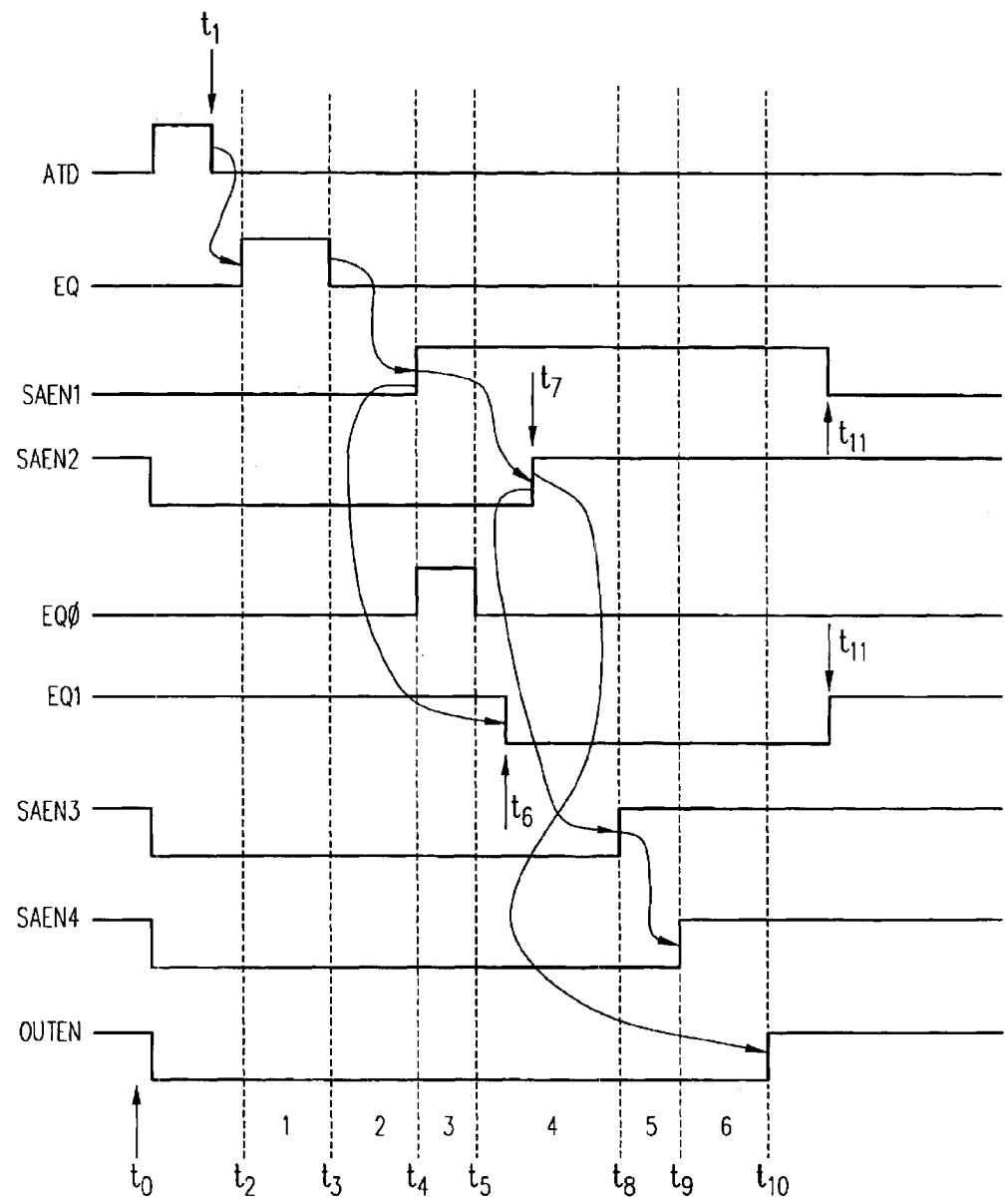
FIG. 2 is a timing diagram showing transitions of selected control signals over an exemplary sensing operation, according to one embodiment of the present invention.

Exemplary implementations of differential amplifiers 102 and 103, bias circuit 104, latch 109 and differential amplifier 112 are shown in detail in FIGS. 3–7. An exemplary sensing operation is illustrated by these implementations in conjunction with the control signals in the timing diagram of FIG. 2. FIG. 2 is a timing diagram showing transitions of selected control signals over an exemplary sensing operation, according to one embodiment of the present invention. As shown in FIG. 2, the beginning of a sensing operation is triggered by an assertion of control signal ATD ("address transition detect") at time $t_0$, whereupon enable signal SAEN2 is deasserted. Deassertion of signal SAEN2 results in enable signals SAEN3 and SAEN4, which enable latch 109 and amplifier 112, respectively, also being deasserted. FIG. 8 shows control circuit 800, which can be used to generate control signals SAEN3, SAEN4, and their respective complementary signals SAEN3b and SAEN4b, using a string of inverters 801–805. As shown in FIG. 8, complementary control signal pairs SAEN3 and SAEN3b and SAEN4 and SAEN4b can be made to have transitions that are offset from each other by an adjustable or programmable amount. In FIG. 8, the programmable timing offset can be achieved by selectively including optional inverters 806 and 807 in the inverter chain. FIG. 2 also shows output enable signal OUTEN which controls one or more output buffers of sense amplifier circuit 100 also being deasserted.

Figure 6:
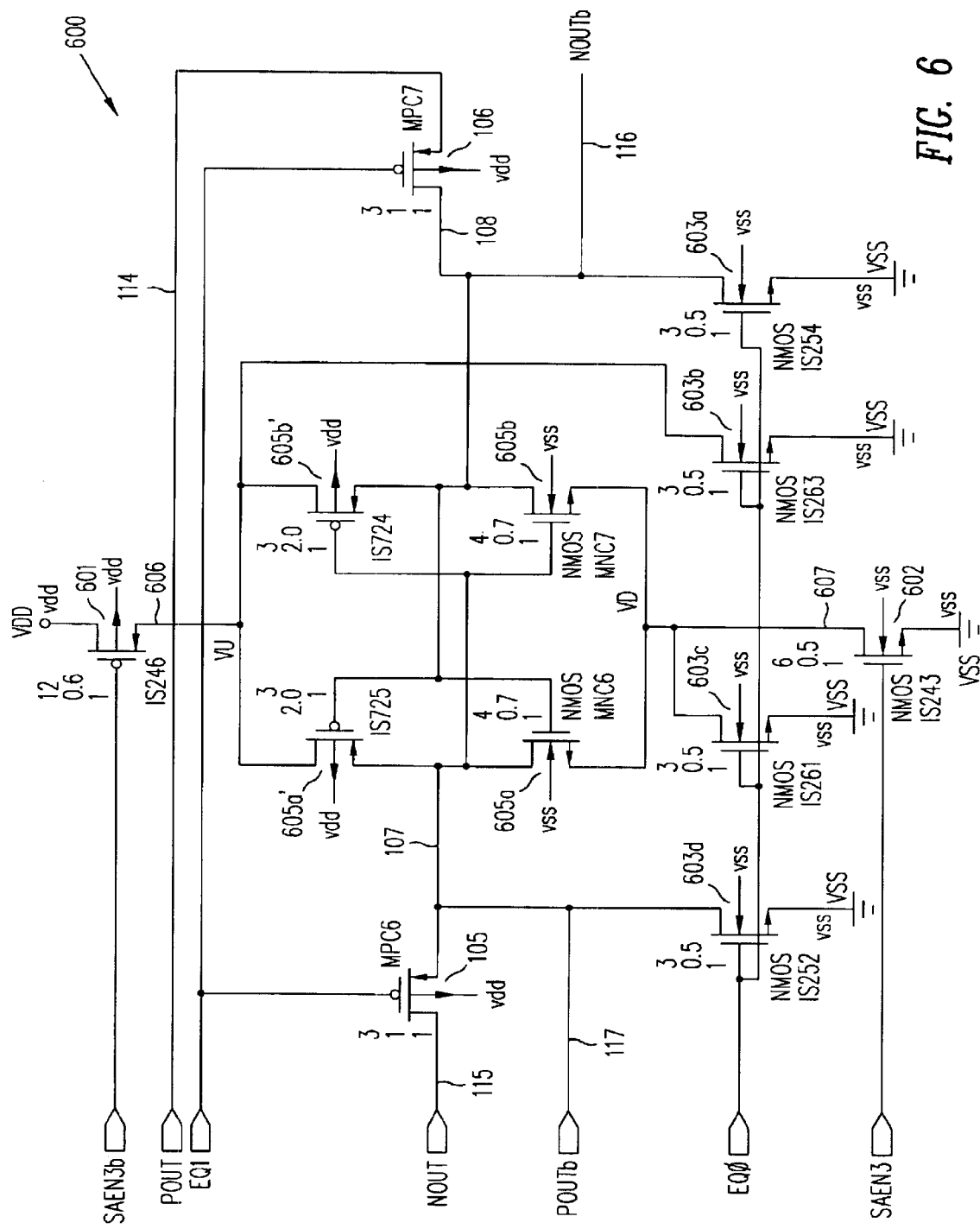
FIG. 6 shows latch circuit 600, suitable for implementing latch 109 of FIG. 1.

As mentioned above, FIGS. 6 and 7 show, respectively, latch circuit 600 and differential amplifier circuit 700, suitable for implementing latch 109 and differential amplifier 112 of FIG. 1. As shown in FIG. 6, latch circuit 600 is coupled to a power supply signal (VDD) and a ground supply signal (VSS) by PMOS transistor 601 and NMOS transistor 602, respectively. Control signal SAEN3 and its complement signal SAEN3b control NMOS transistor 602 and PMOS transistor 601, respectively. Thus, when control signal SAEN3 is deasserted, latch circuit 600 is powered down. Similarly, in FIG. 7, control signal SAEN4 and its complementary signal SAEN4b control connection of differential amplifier circuit 700 with respective ground and power supply signals VSS and VDD. Thus, when control signal SAEN4 is deasserted, differential amplifier circuit 700 is powered down.

Figure 9:
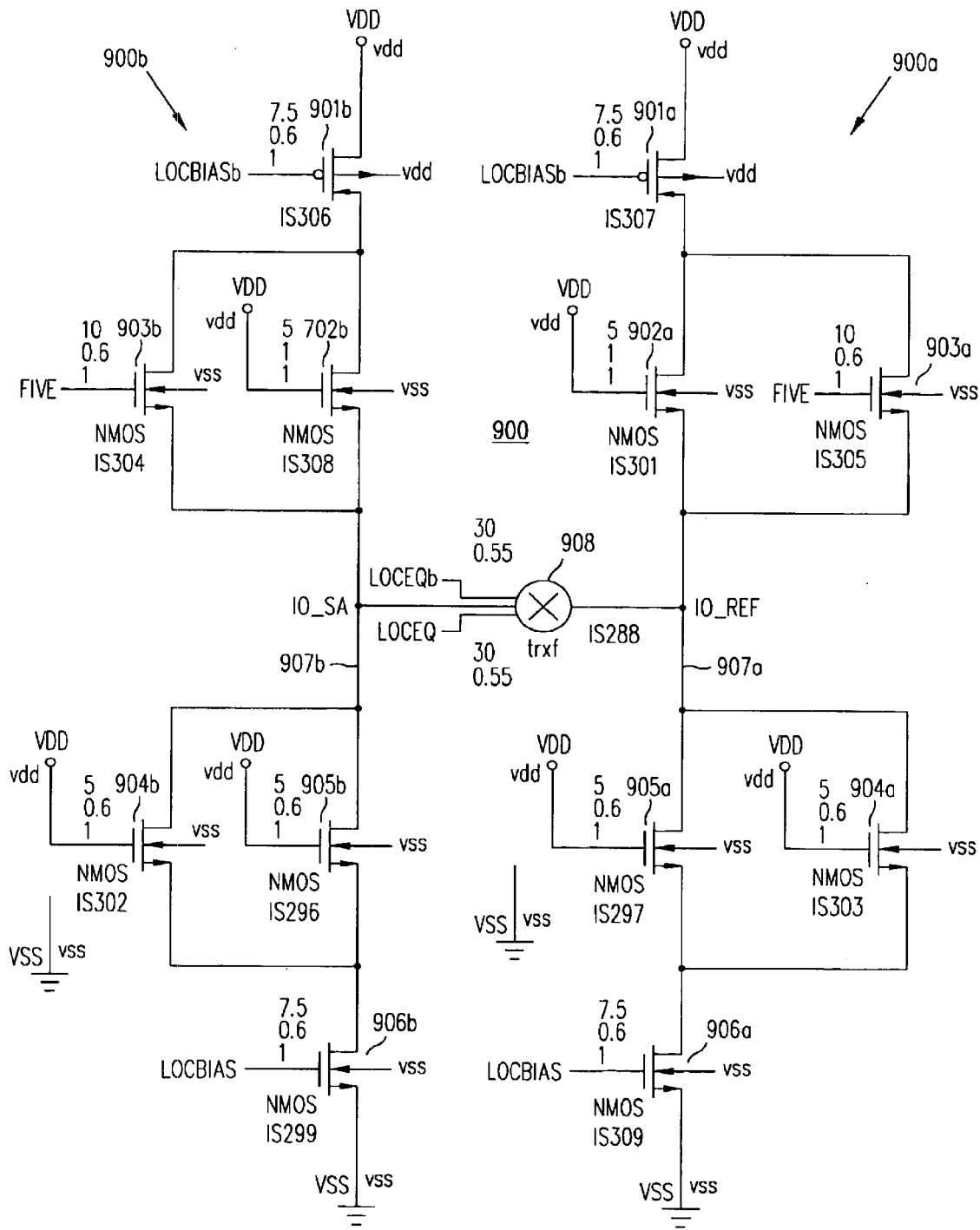
FIG. 9 shows quiescent circuit 900 suitable for use in adjusting a quiescent voltage on terminals 110 and 111 of FIG. 1.

Signal ATD stays asserted until time $t_1$. When signal ATD is deasserted, the falling edge of signal ATD triggers a pulse in control signal EQ at time $t_2$. Control signal EQ can be used to generate complementary control signals LOCEQ and LOCEQb to turn on switch 101 of FIG. 1 to equalize the quiescent voltages on, for example, terminals 110 and 111. The quiescent voltages on terminals 110 and 111 can be set, for example, by circuit 900. FIG. 9 shows circuit 900, including quiescent circuits 900a and 900b, suitable for setting the quiescent voltages at terminals 907a and 907b, respectively. Terminals 907b and 907a are selectively coupled to output terminals of a selected memory cell and a reference cell, respectively. Operations of circuits 900a and 900b are substantially identical. Initially, complementary control signals LOCBIASb and LOCBIAS are asserted to power up circuit 900a by enabling connections to respective power and ground supply signals through PMOS transistor 901a and NMOS transistor 906a. The relative on-resistances of NMOS transistors 902a and 905a—determined by appropriately sizing of these transistors—act as a voltage divider to provide a desired quiescent voltage at terminal 907a. This quiescent voltage can be programmable by selectively switching on parallel transistors, such as transistors 903a and 904a, to vary the effective relative resistances in the voltage divider. In one embodiment, this method is used to provide different quiescent voltages according to the magnitude of a detected supply voltage (e.g., 3 volts vs. 5 volts).

Complementary control signals LOCEQ and LOCEQb render switch 908 conductive momentarily to equalize the quiescent voltages at terminals 907a and 907b before these terminals are coupled to the output terminals of the reference cell and the selected cell, respectively.

Figure 5:
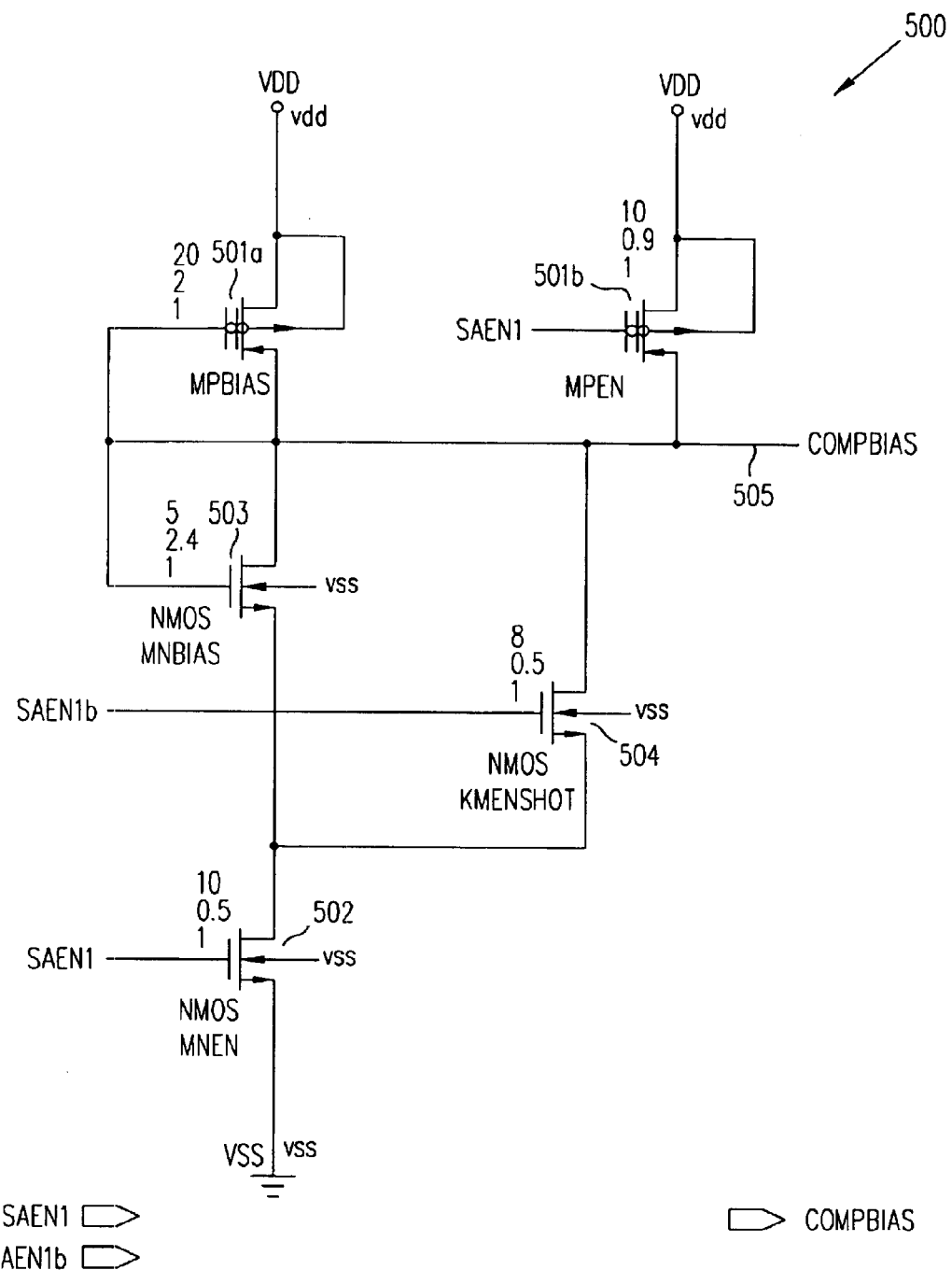
FIG. 5 shows bias circuit 500, suitable for implementing bias circuit 104 of FIG. 1.

Referring back to FIG. 2, the falling edge of the pulse in signal EQ at time $t_3$ triggers assertion of control signals SAEN1 and EQ0 at time $t_4$. According to one embodiment, as shown in control circuit 850 of FIG. 8, complementary control signal SAEN1b is asserted after a predetermined delay. This predetermined delay is used in bias circuit 500 of FIG. 5 to provide bias voltage COMPBIAS, such as used in differential amplifiers 102 and 103 of FIG. 1. In FIG. 5, prior to control signal SAEN1 being asserted, PMOS transistor 501b is conducting, so that transistor 501b pulls terminal 505 to supply voltage VDD. When control signal SAEN1 is asserted in response, for example, to a falling edge of control signal EQ, PMOS transistor 501b is turned off, and NMOS transistor 502 becomes conducting, so that a current path is now formed by current source PMOS transistor 501a, and NMOS transistors 502 and 503. During the predetermined delay in the corresponding transitions of complementary control signals SAEN1 and SAEN1b, NMOS transistors 502 and 504 are simultaneously conducting, thus rapidly establishing bias voltage COMPBIAS.

Figure 3:
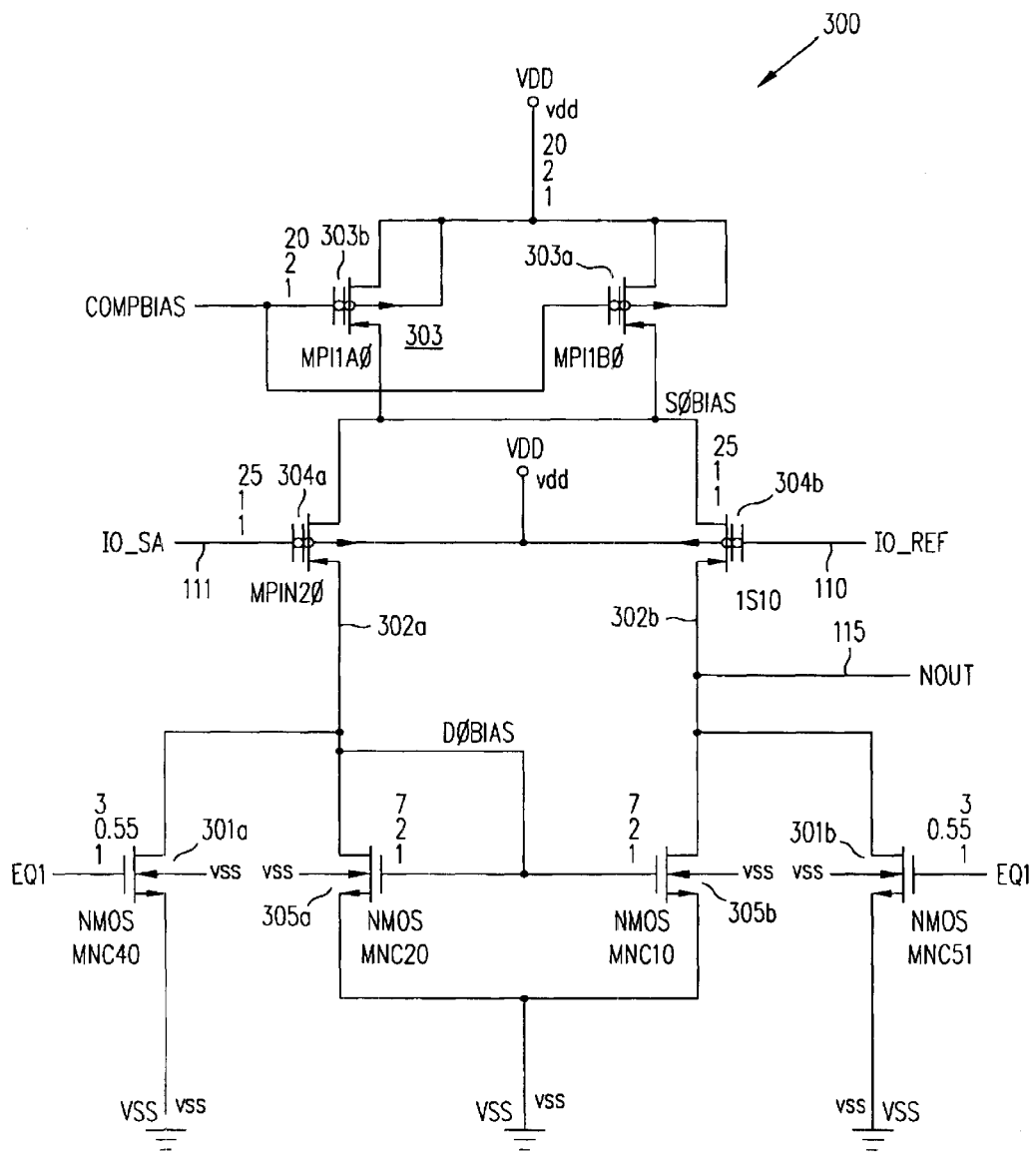
FIGS. 3 and 4 show, respectively, differential amplifier circuits 300 and 400, suitable for implementing either one of differential amplifier circuits 103 and 102 of FIG. 1.
Figure 4:
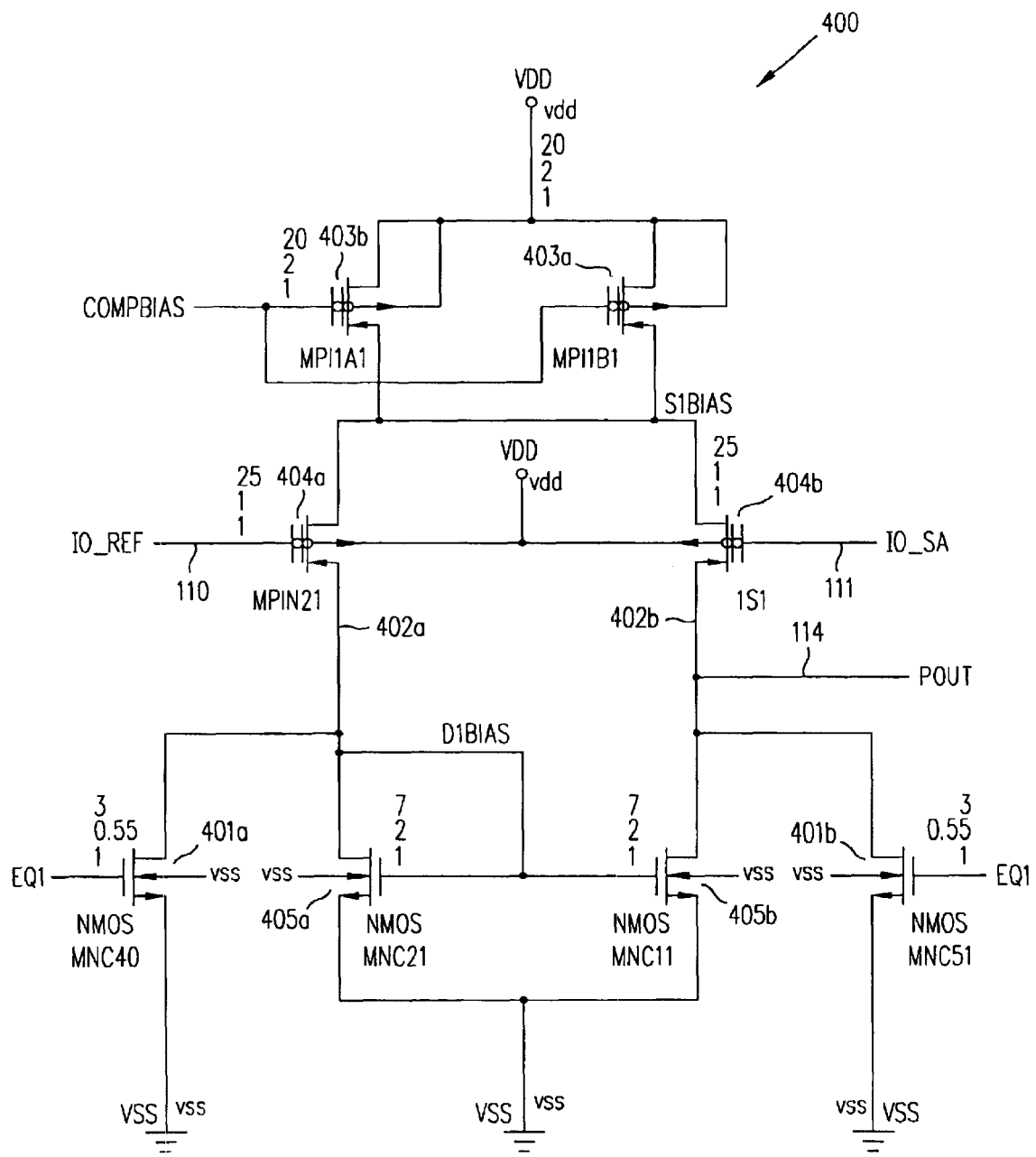

Referring to circuit 850 of FIG. 8, control signal SIGDLP, which is asserted when output terminals of the selected memory cell and the reference cell are respectively coupled to terminals 111 and 110 of FIG. 1, causes control signal EQ0 to be asserted between times $t_4$ and $t_5$. In the meantime, control signal EQ1 remains at its high voltage. Referring to FIG. 3, in differential amplifier circuit 300, the high voltage in control signal EQ1 holds NMOS transistors 301a and 301b at a conducting state, thereby ensuring that terminals 302a and 302b in the two current paths of current source 303 (formed by PMOS transistors 303a and 303b) are equalized at ground supply voltage. The settling of bias signal COMPBIAS from the power supply voltage to the predetermined bias voltage turns on current source 303. The current in current source 303 flows in two current paths formed respectively by PMOS transistor 304a and NMOS transistor 305a, and PMOS transistor 304b and NMOS transistor 305b. At time $t_6$, when control signal EQ1 goes to a low or ground voltage, the differential signal across terminals 111 and 110 modulate the relative transconductances of PMOS transistors 304a and 304b, so that the output voltage at terminal 302b reflects the relative voltages at terminals 110 and 111, respectively. The operation of differential amplifier circuit 400 of FIG. 4 is substantially similar to the operation of differential amplifier 300 of FIG. 3 described above, except that the relative polarity of the input differential signal of FIG. 3 is reversed from that of FIG. 4. To minimize repetition, a detailed description of the operation of differential amplifier 400 of FIG. 4 is therefore omitted.

FIG. 6 shows latch circuit 600, which is suitable for implementing latch 109 of FIG. 1 and incorporates PMOS transistors 105 and 106. Latch circuit 600 stores a data signal in a latch formed by two cross-coupled inverters (i.e., inverters formed respectively by PMOS transistor 604a and NMOS transistor 605a and PMOS transistor 604b and NMOS transistor 605b). Referring back to circuit 850 of FIG. 8 and FIG. 2, as discussed above, signal EQ0 is asserted between times $t_4$ and $t_5$, thereby pulling terminals 116, 117 and 606 and 607 to ground supply voltage, prior to circuit 600 being powered up when control signal SAEN3 and SAEN3b are asserted at time $t_8$. (Terminals 606 and 607 provides connections to power and ground supply voltages via PMOS transistor 601 and NMOS transistor 602). In this embodiment, while the differential output signal of latch circuit 600 at terminals 116 and 117 is developing, the output voltage of differential amplifier 112 is at a logic high voltage, because of a precharge operation.

As shown in circuit 850 and FIG. 2, subsequent to control signals SIGDLP and SAEN1 being asserted, control signal EQ1 goes to a low voltage at time $t_6$, so that PMOS transistors 105 and 106 become conducting, while at the same time allowing a differential signal to develop across terminals 114 and 115 and across input terminals 107 and 108. As shown in circuit 800 of FIG. 8 and FIG. 2, control signal SAEN2 causes SAEN3 to be asserted at time $t_8$, thereby powering up latch circuit 600. At this time, the differential signal across terminals 114 and 115 is substantially developed. As a result, the high gain of latch circuit 600 resolves the differential output signal across terminals 116 and 117 to a definite state very rapidly. Further, as differential amplifier 112 is precharged to a logic high voltage, the output voltage of differential amplifier 112 is resolved to the final logic value without undesirable transient signal fluctuations, as is common in prior art sense amplifier output signals.

Figure 7:
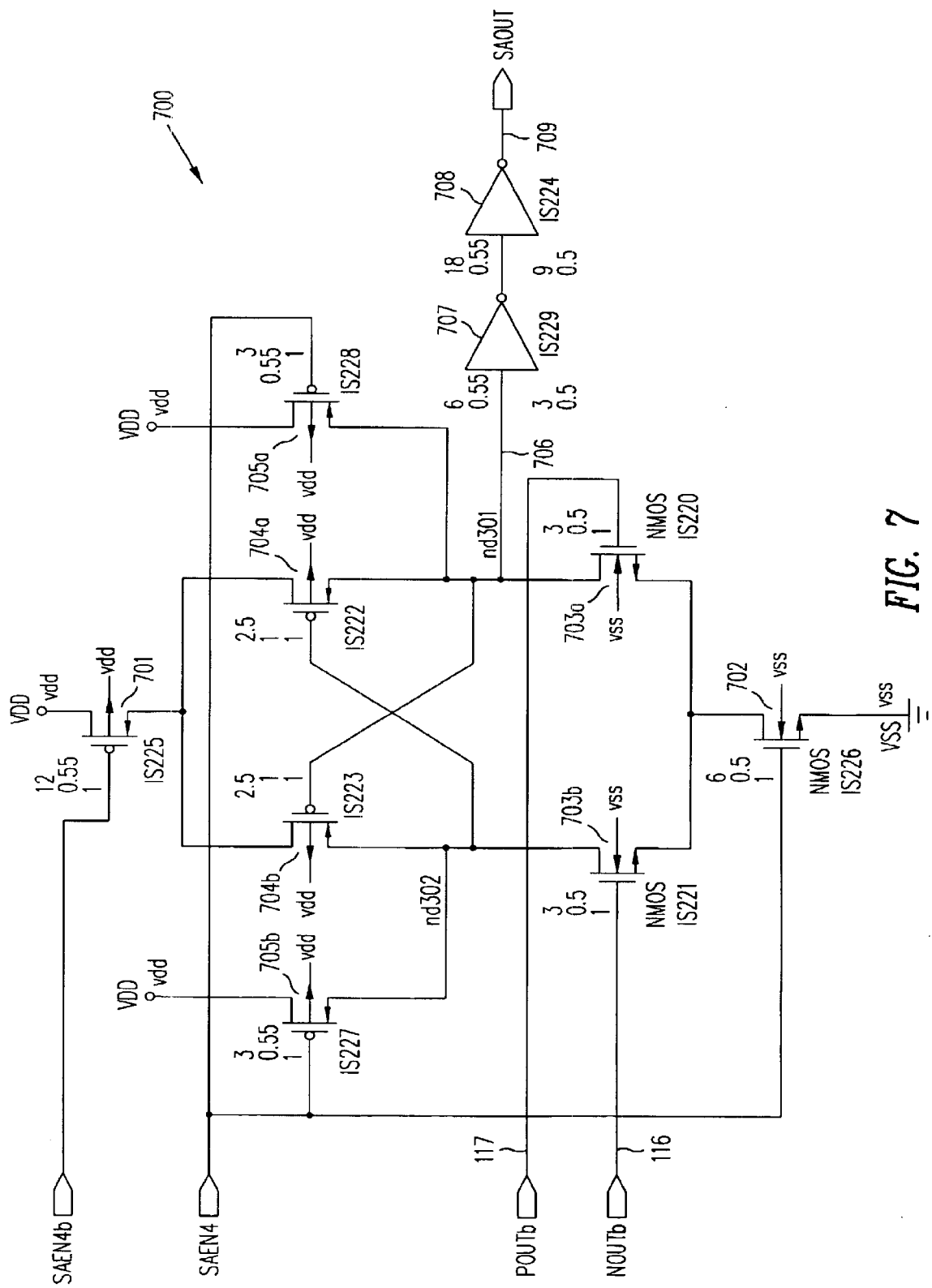
FIG. 7 shows differential amplifier circuit 700, suitable for implementing differential amplifier 112 of FIG. 1.
Figure 8:
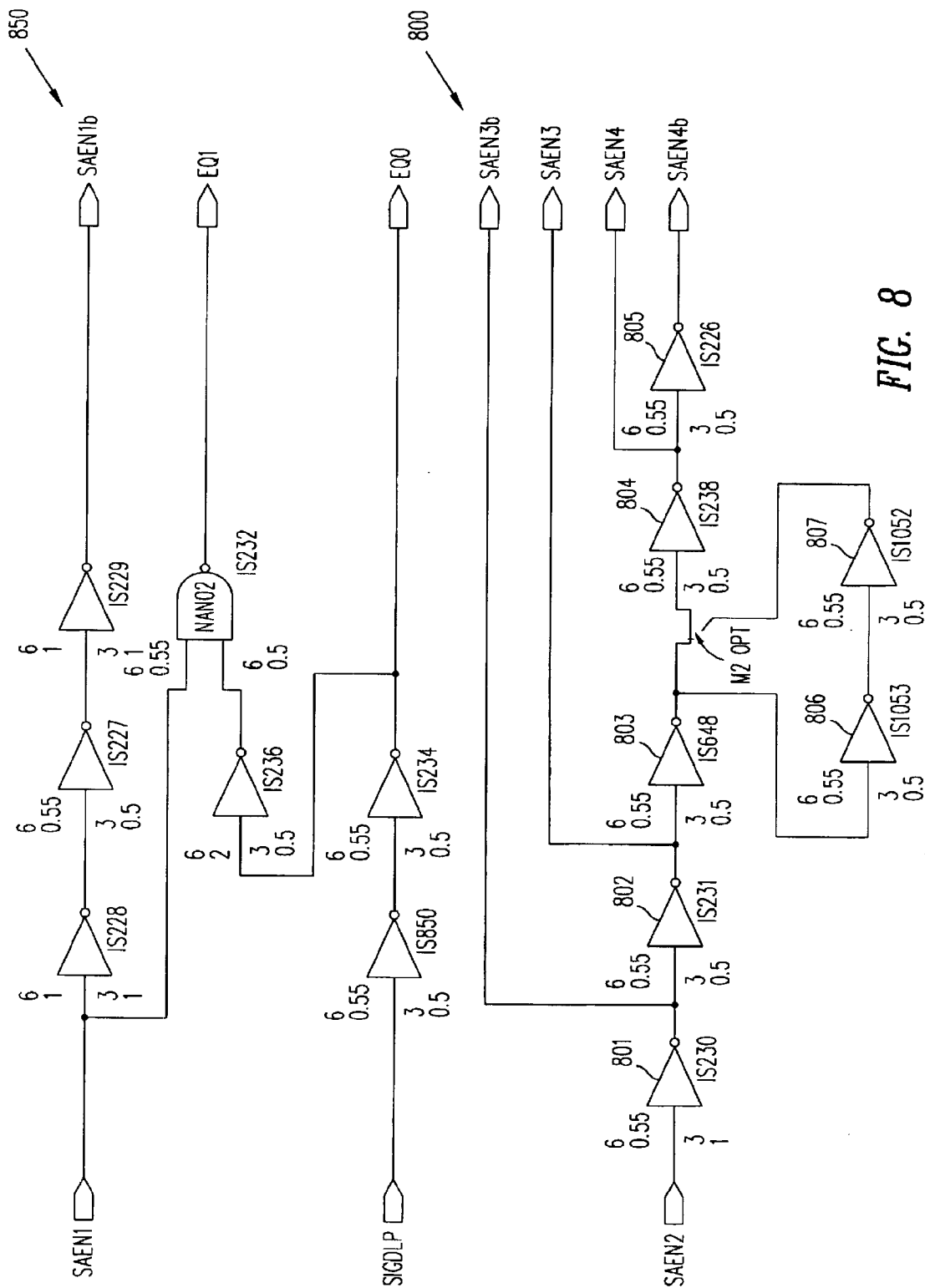
FIG. 8 shows control circuits 800 and 850, suitable for generating numerous control signals shown in FIG. 1.

FIG. 7 shows differential amplifier circuit 700, which is suitable for implementing differential amplifier 112. Referring to FIGS. 2, 8 and 7, at time $t_9$, control signals SAEN4 and SAEN4b are asserted. Thus PMOS transistor 701 and NMOS transistor 702 become conducting, thus powering up differential amplifier circuit 700. Asserted control signal SAEN4 also turns off PMOS transistors 705a and 705b, which has precharged the output voltage at terminal 706 to the logic high voltage. As differential amplifier circuit 700 powers up, the current in PMOS transistor 701 is divided into the two current paths formed by PMOS transistor 704b and NMOS transistor 704b, and PMOS transistor 704a and NMOS transistor 704a. When differential amplifier circuit 700 powers up, the voltages on terminals 116 and 117, which may not be fully developed to the logic voltage levels, provides a bias to the input terminals of differential amplifier circuit 700. The relative magnitudes of the currents in these current paths depend on the differential voltage across terminals 116 and 117. If the voltage at terminal 116 is higher than the voltage at terminal 117, the output voltage at terminal 706 is pulled to logic low (i.e., ground). Conversely, the output voltage at terminal 706 remains at logic high. Inverters 707 and 708 further amplify and translate the voltage of output signal SAOUT at terminal 709 to full CMOS logic voltage levels.

Accordingly, a sense amplifier of high performance and low power dissipation is achieved. The propagation of bias voltages from differential amplifiers 102 and 103 to latch 109, and then further to differential amplifier 112 provides noise immunity and fast settling of the output signal to the final output value.

The above detailed description is provided to illustrate the specific embodiments of the present invention and is not intended to be limiting. Numerous modifications and variations within the scope of the present invention are possible. The present invention is set forth in the following claims.

We claim:

1. A sense amplifier receiving an input signal and a reference signal, comprising:

a first differential amplifier and a differential second amplifier each receiving the input signal and the reference signal to provide a differential signal across output terminals of the first and second differential amplifiers, wherein the differential signal represents an amplified difference in voltage across the input signal and the reference signal;

a latch circuit receiving the amplified differential signal to provide as output first and second logic signals, the first and second logic signal representing complementary logic values;

first and second switches that couple the differential signal to the latch circuit;

an output amplifier receiving the first and second logic signals to provide an output logic signal.

2. A sense amplifier as in claim 1 wherein, during a sensing operation, the first and second amplifiers are powered up prior to the latch circuit and the output amplifier are powered up.

3. A sense amplifier as in claim 1, wherein the first and second switches isolate the differential signal from the latch circuit until after a voltage difference between the input signal and the reference signal exceeds a predetermined value.

4. A sense amplifier as in claim 1 further comprising a reset circuit that resets selected terminals in the latch circuit to a predetermined voltage.

5. A sense amplifier as in claim 4 wherein the reset circuit resets the selected terminals prior to the latch circuit being powered up.

6. A sense amplifier as in claim 1, further comprising a quiescent circuit for setting a quiescent voltage in each of the input signal and the reference signal.

7. A sense amplifier as in claim 6, further comprising an equalizing switch for equalizing the quiescent voltages of the input signal and the reference signal.

8. A sense amplifier as in claim 1, further comprising a bias circuit that provides a bias voltage to the first and second differential amplifiers.

9. A sense amplifier as in claim 8, wherein the bias circuit receives a control signal and a logic complement of the control signal having corresponding transitions offset by a predetermined delay, the bias circuit being provided first and second current paths controlled respectively by the control signal and the logic complement of the control signal, such that both current paths are conducting during the predetermined delay.

10. A sense amplifier as in claim 1, wherein the output amplifier is precharged to a predetermined output voltage prior to the sense amplifier completing a sensing operation.

* * * * *